United States Patent
Chandrasekaran et al.

(10) Patent No.: US 8,537,041 B2
(45) Date of Patent: Sep. 17, 2013

(54) INTERPOLATION-BASED DIGITAL PRE-DISTORTION ARCHITECTURE

(75) Inventors: Rajiv Chandrasekaran, Bridgewater, NJ (US); George P. Vella-Coleiro, Summit, NJ (US)

(73) Assignee: Andrew LLC, Hickory, NC (US)

( * ) Notice: Subject to any disclaimer, the term of this patent is extended or adjusted under 35 U.S.C. 154(b) by 84 days.

(21) Appl. No.: 13/289,010

(22) Filed: Nov. 4, 2011

(65) Prior Publication Data

US 2012/0286985 A1 Nov. 15, 2012

Related U.S. Application Data

(60) Provisional application No. 61/485,149, filed on May 12, 2011.

(51) Int. Cl.
*H03M 1/66* (2006.01)
(52) U.S. Cl.
USPC ........... 341/144; 330/149; 375/279; 375/298; 455/114.3; 341/140; 341/142; 341/147; 341/150
(58) Field of Classification Search
USPC ......... 341/144–150; 330/149; 375/279–298; 455/114.3
See application file for complete search history.

(56) References Cited

U.S. PATENT DOCUMENTS

| | | | |
|---|---|---|---|
| 5,867,065 A | 2/1999 | Leyendecker | |
| 6,298,097 B1 | 10/2001 | Shalom | |
| 6,697,436 B1 | 2/2004 | Wright et al. | |
| 6,798,843 B1 | 9/2004 | Wright et al. | |
| 7,197,085 B1 | 3/2007 | Vella-Coleiro | |
| 7,251,293 B2 | 7/2007 | Vella-Coleiro | |
| 7,680,210 B2 | 3/2010 | Bode et al. | |
| 7,693,208 B2 | 4/2010 | Marsili et al. | |
| 7,729,445 B2 | 6/2010 | Ravi et al. | |
| 7,729,446 B2 | 6/2010 | Copeland | |
| 7,773,692 B2 | 8/2010 | Copeland et al. | |
| 7,822,146 B2 | 10/2010 | Copeland | |
| 7,991,074 B2 | 8/2011 | Nentwig | |

(Continued)

OTHER PUBLICATIONS

Notification of Transmittal of the International Search Report and the Written Opinion; Mailed Jul. 25, 2012 for corresponding PCT Application No. PCT/US2012/035925.

(Continued)

*Primary Examiner* — Lam T Mai
(74) *Attorney, Agent, or Firm* — Mendelsohn, Drucker & Dunleavy, P.C.; Steve Mendelsohn (57) ABSTRACT

A non-linear amplifier is linearized using interpolation-based digital pre-distortion (DPD). In one embodiment, the digital input signal is interpolated to generate a higher-sample-rate signal that is then pre-distorted. The resulting higher-sample-rate pre-distorted signal is then decimated to generate a final pre-distorted digital signal that is converted into an analog pre-distorted signal by a digital-to-analog converter (DAC) before being applied to the amplifier. In a polyphase embodiment, different versions of the original input digital signal are generated, where each version is then pre-distorted using a different DPD module to generate a different intermediate pre-distorted digital signal. The intermediate pre-distorted signals are filtered and combined to generate the final pre-distorted digital signal. In both embodiments, better linearization (e.g., less aliasing) can be achieved without increasing the sample rate of the DAC and, in the polyphase embodiment, without increasing the processing speed of the DPD modules.

16 Claims, 5 Drawing Sheets (56) References Cited

U.S. PATENT DOCUMENTS

| | | |
|---|---|---|
| 7,994,856 B2 * | 8/2011 | Li et al. .................... 330/149 |
| 8,218,676 B2 * | 7/2012 | Borkar et al. ............. 375/296 |
| 2006/0245517 A1 | 11/2006 | Ikedo et al. |
| 2008/0075194 A1 | 3/2008 | Ravi et al. |
| 2009/0161793 A1 | 6/2009 | Nentwig |
| 2010/0172437 A1 | 7/2010 | Brown et al. |

OTHER PUBLICATIONS

Valera T. L., "An Adaptive Predistorter for TDMA Transmitters Using a Heterodyne Architecture", Vehicular Technology Conference, 1999 IEEE 49th Houston, TX, USA May 16-20, 1999; Piscataway, NJ, USA, IEEE, US, vol. 3, May 16, 1999; pp. 1915-1919.

* cited by examiner

INTERPOLATION-BASED DIGITAL PRE-DISTORTION ARCHITECTURE

CROSS-REFERENCE TO RELATED APPLICATIONS

This application claims the benefit of the filing date of U.S. provisional application No. 61/485,149, filed on May 12, 2011 as, the teachings of which are incorporated herein by reference in their entirety.

BACKGROUND

1. Field of the Invention

The present invention relates to signal processing and, more specifically but not exclusively, to linearizing non-linear systems, such as non-linear amplifiers, using digital pre-distortion.

2. Description of the Related Art

Introduction

This section introduces aspects that may help facilitate a better understanding of the invention. Accordingly, the statements of this section are to be read in this light and are not to be understood as admissions about what is prior art or what is not prior art.

Figure 1:
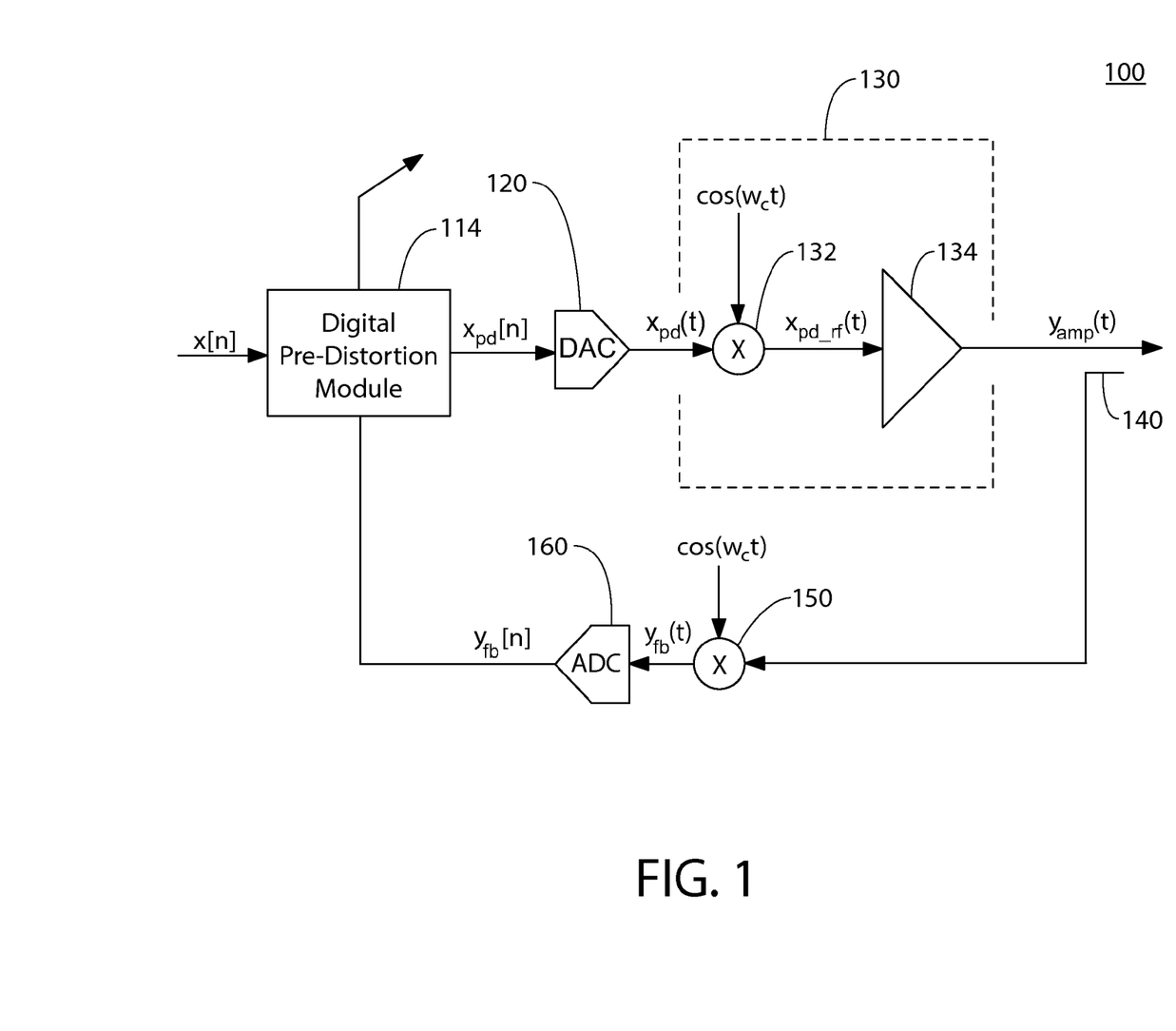
FIG. 1 shows a schematic block diagram of a signal-processing system that implements a conventional linearization scheme that employs digital pre-distortion to linearize a non-linear sub-system having a non-linear amplifier.

FIG. 1 shows a schematic block diagram of signal-processing system 100, which implements a conventional linearization scheme that employs digital pre-distortion to linearize an analog sub-system 130 having a non-linear amplifier 134. Signal-processing system 100 receives a digital input signal $x[n]$ and generates a linearized, amplified, analog output signal $y_{amp}$ (t).

In particular, the digital (e.g., baseband or IF (intermediate frequency)) input signal $x[n]$ is processed by digital pre-distortion (DPD) module 114 to yield a pre-distorted digital signal $x_{pd}$ [n], which is converted into an analog pre-distorted signal $x_{pd}$ (t) using a digital-to-analog converter (DAC) 120. The output of the DAC is frequency converted to a desired frequency (e.g., RF (radio frequency)) using upconverter 132 to yield an RF analog pre-distorted signal $x_{pd\_rf}(t)=\text{Re}\{x_{pd}(t)e^{jw_ct}\}$. The RF signal $x_{pd\_rf}(t)$ is amplified by non-linear amplifier 134 to yield the output signal $y_{amp}$ (t).

Purpose of Digital Pre-Distortion

The purpose of the digital pre-distortion in signal-processing system 100 is to ensure that the output signal $y_{amp}$ (t) is close to a linear scaled version of the (theoretical) analog version $x(t)$ of the digital input signal $x[n]$. That is, $y_{amp}(t) \cong Gx(t)$, where G is a constant. Note that, in the above notation, the digital signal $x[n]$ is a sampled version of the analog signal $x(t)$.

Computation of the Digital Pre-Distortion Function

In a typical implementation, a small portion of the amplifier output signal $y_{amp}$ (t) is removed at tap 140 and mixed down to a suitable intermediate frequency (IF) (or, alternatively, to baseband) using a downconverter 150. The resulting downconverted feedback signal $y_{fb}$ (t) is digitized using an analog-to-digital (ADC) converter 160 to yield digital feedback signal $y_{fb}$ [n].

The digital pre-distortion function implemented by module 114 is initially computed and subsequently adaptively updated by comparing the input signal $x[n]$ with the feedback signal $y_{fb}$ [n] using a controller (not shown in FIG. 1) that may be implemented as part of or separate from DPD module 114. The computation can be performed in one of (at least) the following two ways:

1) In a non-real-time implementation, a block of samples of the input signal $x[n]$ and a block of samples of the feedback signal $y_{fb}$ [n] are captured and processed by the controller offline to estimate the pre-distortion function. Such estimation is typically performed in a DSP (digital signal processor) or microcontroller.

2) In a real-time implementation, the pre-distortion function is updated by the controller on a sample-by-sample basis using an adaptive non-linear filter structure.

Pre-Processing

In both cases, one or both of the signals $x[n]$ and $y_{fb}$ [n] are pre-processed before the controller estimates the pre-distortion function. The pre-processing aligns the delays, gains, and phases of the two signals. Mathematically, this can be described as follows:

Estimate the delay $\tau$ and the complex gain $\alpha$ that minimizes the cost function:

$$E\{(x[n-\tau]-\alpha y_{fb}[n])^2\},$$

where $E\{\cdot\}$ denotes the expectation value operator (or average). In the non-real-time implementation, minimizing the cost function reduces to estimating values for the delay $\tau$ and the complex gain $\alpha$ that minimize the cost function in the least-squares sense. Note that the delay $\tau$ and the complex gain $\alpha$ can be estimated successively and/or jointly. Also, note that the delay $\tau$ can be a fractional delay. Techniques for least-squares estimation are well-known. See, for example, W. H. Press, B. P. Flannery, S. A. Teukolsky, and W. T. Vetterling, *Numerical Recipes: The Art of Scientific Computing* (New York: Cambridge University Press, 1986), the teachings of which are incorporated herein by reference.

Digital Pre-Distortion Function

After the pre-processing, the digital pre-distortion can be described as estimating the arbitrary non-linear function $f_{pd}$ ($\cdot$) that minimizes the cost function:

$$E\{(f_{pd}(x[n-\tau],x[n-\tau-1],x[n-\tau+1],\ldots)-\alpha y_{fb}[n])^2\}. \quad (1)$$

Limitations of Prior Art

The digital pre-distortion function is a discrete-time implementation of the following function:

$$x_{pd}[n]=f_{pd}(x[n-\tau],x[n-\tau-1],x[n-\tau+1],\ldots) \quad (2)$$

where $\tau$ is a delay and $f_{pd}$ ($\cdot$) is an arbitrary function.

An alternative representation of the above function is:

$$\begin{aligned}x_{pd}[n] &= f_{pd}(x[n-\tau], x[n-\tau-1], x[n-\tau+1], \ldots) \\ &= \left(\frac{f_{pd}(x[n-\tau], x[n-\tau-1], x[n-\tau+1], \ldots)}{x[n-\tau]}\right) \cdot \\ &\quad x[n-\tau] \\ &= g_{pd}(x[n-\tau], x[n-\tau-1], x[n-\tau+1], \ldots) \cdot \\ &\quad x[n-\tau] \\ &= g_{pd}[n] \cdot x[n-\tau]\end{aligned} \quad (3)$$

where $g_{pd}$ [n] is the pre-distortion gain.

Let $x_{pd}$ (t), $g_{pd}$ (t), $x(t-\tau)$ denote the continuous time equivalents of the digital signals $x_{pd}$ [n], $g_{pd}$ [n], $x[n-\tau]$. That is:

$$x_{pd}[n]=x(t)_{t=nT}$$

$$g_{pd}[n]=g_{pd}(t)_{t=nT}$$

$$x[n-\tau]=x(t-\tau)_{t=nT} \quad (4)$$

where $F_s=1/T$ is the sample rate of the signals.

From signal theory, multiplication of signals in the time domain is equivalent to the convolution ("*") of the corresponding spectrums in the frequency domain. Let $X_{pd}(f)$, $G_{pd}(f)$, $X(f)$ denote the Fourier transforms of $x_{pd}(t)$, $g_{pd}(t)$, $x(t-\tau)$, respectively. Then we can write:

$$X_{pd}(f) = G_{pd}(f) * X(f). \quad (5)$$

Let us denote the signal bandwidths of the signals $x_{pd}(t)$, $g_{pd}(t)$, $x(t-\tau)$ by $BW_{x_{pd}}$, $BW_{g_{pd}}$, $BW_x$.

Therefore, from Equation (5):

$$BW_{x_{pd}} = BW_{g_{pd}} + BW_x \quad (6)$$

In other words, the bandwidth $BW_{x_{pd}}$ of the pre-distorted signal is equal to the sum of the bandwidth $BW_{g_{pd}}$ of the pre-distortion gain and the bandwidth $BW_x$ of the input signal. If the theoretical bandwidth $BW_{x_{pd}}$ of the pre-distorted signal is larger than the signal sample rate $F_s$ (i.e., $BW_{x_{pd}} > F_s$), then the pre-distortion signal will have aliasing products from sampling. These aliasing products can result in degradation of the pre-distortion performance.

SUMMARY

In one embodiment, the present invention is a signal-processing system that generates an analog output signal from a digital input signal. The system comprises a digital pre-distortion (DPD) sub-system, a digital-to-analog converter (DAC), and an analog sub-system. The DPD sub-system performs DPD processing to generate a final pre-distorted digital signal from the digital input signal, wherein the DPD sub-system interpolates the digital input signal based on an interpolation factor greater than one prior to performing the DPD processing. The DAC converts the final pre-distorted digital signal into an analog pre-distorted signal. The analog sub-system generates the analog output signal from the analog pre-distorted signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

One way to overcome the limitations of aliasing in the pre-distortion signal in signal-processing system 100 of FIG. 1 is to increase the sample rate of the system, including the DAC. However, this will require both the digital pre-distortion module and the DAC to run at a higher sample rate, which may be impractical.

One way to avoid increasing the sample rate of the DAC is to increase the sample rate of the input signal (e.g., by L-fold interpolation) prior to digital pre-distortion and then decrease the sample rate of the resulting pre-distorted signal (e.g., by L-fold decimation) to provide a pre-distorted signal to the DAC having the same sample rate as the original input signal. This approach requires the digital pre-distortion module to operate at an L-fold higher processing speed.

Another way to avoid increasing the sample rate of the DAC is to employ a polyphase architecture that addresses the limitations in the prior art due to aliasing in the pre-distortion signal, without increasing the processing speed of the digital pre-distortion processing and without increasing the sample rate of the DAC. The polyphase representation of a filter is a structure, where the input sequence of samples is decomposed into a set of periodically interleaved sub-sequences, each of which is operated on by a corresponding subset of the filter coefficients.

Figure 2:
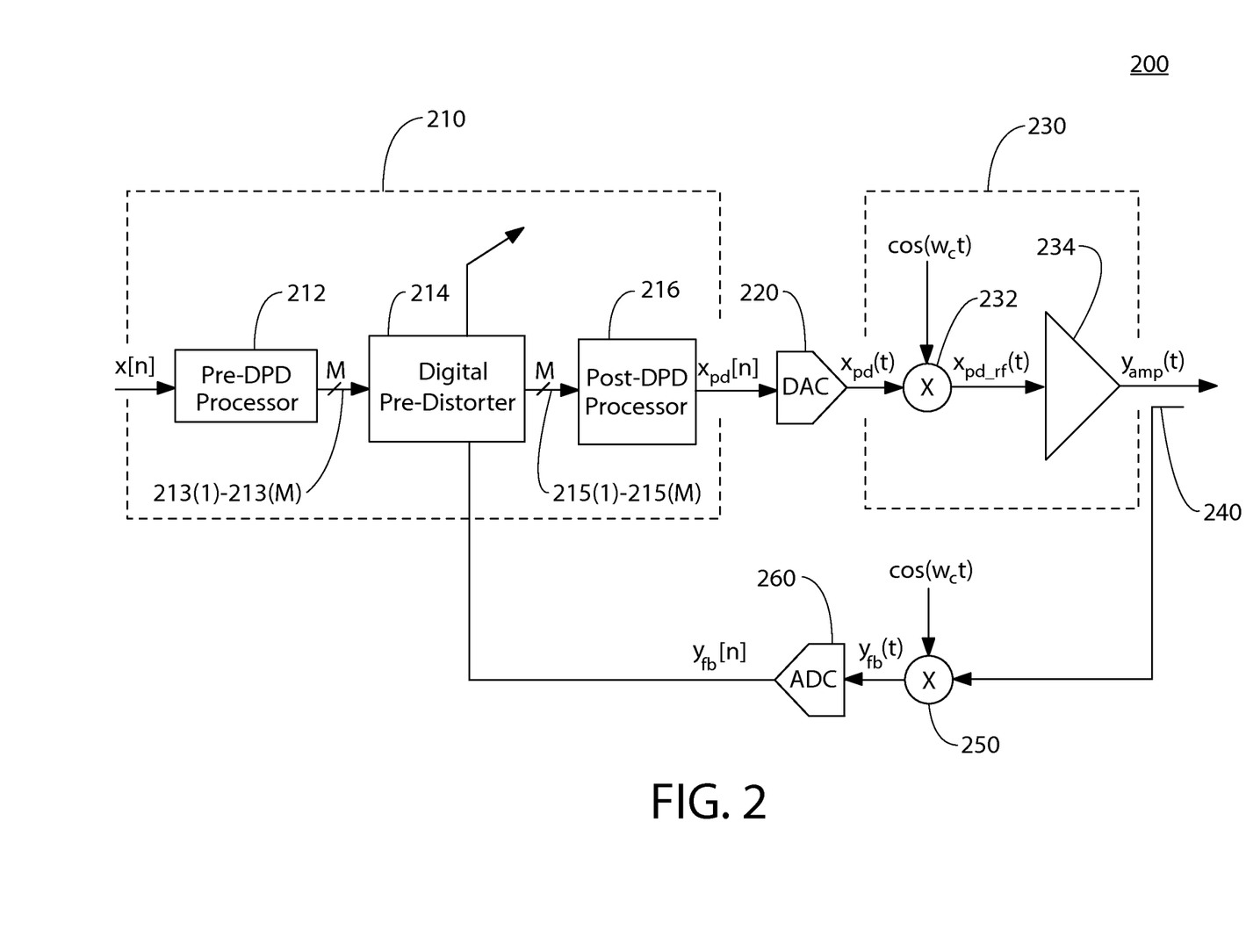
FIG. 2 shows a schematic block diagram of a signal-processing system that implements a linearization scheme, according to certain embodiments of the present invention, that employs digital pre-distortion to linearize an analog non-linear sub-system having a non-linear amplifier.

FIG. 2 shows a schematic block diagram of signal-processing system 200, which implements an interpolation-based linearization scheme, according to certain embodiments of the present invention, that employs digital pre-distortion to linearize an analog sub-system 230 having a non-linear amplifier 234. Signal-processing system 200 receives a digital input signal x[n] and generates a linearized, amplified, analog output signal $y_{amp}(t)$. The linearization scheme of FIG. 2 is analogous to the linearization scheme of FIG. 1, except that digital pre-distortion module 114 of FIG. 1 is replaced by digital pre-distortion (DPD) sub-system 210 having digital pre-DPD processor 212, digital pre-distorter 214, and digital post-DPD processor 216. The linearization scheme of FIG. 2 is designed to address the limitations in the linearization scheme of FIG. 1 related to aliasing in the pre-distortion signal, but without incurring the disadvantage of undesirably high DAC sample rates.

Pre-DPD processor 212 receives the digital input signal x[n] having a sample rate $F_s$ and generates M versions 213(1)-213(M) of the digital input signal, where M is a positive integer. As explained in further detail below, pre-DPD processor 212 applies an interpolation factor L to generate the M versions 213(1)-213(M), where the interpolation factor L is an integer greater than one.

Pre-distorter 214 has M DPD modules (not shown in FIG. 2), where each DPD module performs DPD processing on a corresponding version 213(i) of the digital input signal, to generate M intermediate pre-distorted signals 215(1)-215(M).

Post-DPD processor 216 receives the M intermediate pre-distorted signals 215(1)-215(M) and applies a decimation factor N to generate the final pre-distorted digital signal $x_{pd}$[n], where N is a positive integer. This final pre-distorted digital signal is then applied to DAC 220, which converts the final pre-distorted digital signal $x_{pd}$[n] into an analog pre-distorted signal $x_{pd}(t)$.

The remaining components of signal-processing system 200 of FIG. 2 (i.e., upconverter 232, amplifier 234, tap 240, downconverter 250, and ADC 260) are analogous to the corresponding components of signal-processing system 100 of FIG. 1.

As described, the particular implementation of signal-processing system 100 depends on the values selected for three factors: (1) the interpolation factor L employed in pre-DPD processor 212, (2) the number M of DPD modules employed in pre-distorter 214, and (3) the decimation factor N employed in post-DPD processor 216.

As described in further detail below in the context of FIGS. 3 and 4, in one set of implementations of signal-processing system 200, the interpolation factor L is equal to the decimation factor N (e.g., two, as in FIG. 4), where pre-distorter 214 has only one DPD module (i.e., M=1). In that case, pre-DPD processor 212 can be implemented with an interpolator that interpolates the digital input signal to generate the single higher-sample-rate version 213(1) of the digital input signal, whose sample rate is L times the sample rate $F_s$ of the digital input signal x[n]. In order to handle that higher sample rate, the processing speed of the single DPD module in pre-distorter 214 is L times the processing speed of DPD module 114 of FIG. 1 for a comparable digital input signal (i.e., a digital input signal having the same input sample rate). In addition, post-DPD processor 216 can be implemented with a decimator that decimates the single higher-sample-rate intermediate pre-distorted signal 215(1) generated by pre-distorter 214 to generate the final pre-distorted digital signal $x_{pd}$[n] having a sample rate equal to the sample rate $F_s$ of the original digital input signal x[n]. In that case, the sample rate of DAC 220 can be the same as the sample rate of a comparable DAC 120 of FIG. 1 for a comparable digital input signal.

As described in further detail below in the context of FIG. 5, in another set of implementations of signal-processing system 200, all three factors L, M, and N are the same. For example, in FIG. 5, L=M=N=2, where pre-distorter 214 has two DPD modules operating in parallel. In that case, pre-DPD processor 212 generates two versions 213(1) and 213(2) of the digital input signal, where the sample rate of each version 213(i) is the same as the sample rate $F_s$ of the digital input signal x[n]. One of the two versions consists of samples whose values are interpolated between the values of the input samples, and the other version consists of the input samples delayed by an amount equal to the delay of the interpolator. Each DPD module in pre-distorter 214 performs DPD processing on a different version 213(i) of the digital input signal, where the processing speed of each DPD module can be the same as the processing speed of a comparable DPD module 114 of FIG. 1. Note that the sample rate of each intermediate pre-distorted signal 215(i) generated by pre-distorter 214 is the same as the sample rate $F_s$ of the digital input signal x[n]. In addition, post-DPD processor 216 filters and combines the two intermediate pre-distorted signals 215(1) and 215(2) generated by pre-distorter 214 to generate the final pre-distorted digital signal $x_{pd}$[n] having a sample rate equal to the sample rate $F_s$ of the original digital input signal x[n]. As such, the sample rate of DAC 220 can again be the same as the sample rate of a comparable DAC 120 of FIG. 1.

Note that other implementations of signal-processing system 100 are possible having different combinations of values for the factors L, M, and N. In some of these implementations, the processing speed of each DPD module may be greater than the processing speed of a comparable DPD module AC of FIG. 1, but less than L times that speed. For example, in one possible implementation, L=4 and M=2. In this case, pre-DPD processor 212 would generate two versions 213(1) and 213(2) of the digital input signal x[n], where each version has twice the sampling rate $F_s$ of x[n], and pre-distorter 214 would have two DPD modules, each operating at twice the processing speed of a comparable DPD module 114 of FIG. 1.

Continuing with this example, depending on the particular implementation, the decimation factor N could be either one or two. If N=1, then post-DPD processor 216 would combine the two intermediate pre-distorted signals 215(1) and 215(2) to generate the final pre-distorted digital signal $x_{pd}$[n] having a sample rate four times the sample rate $F_s$ of the digital input signal x[n]. In that case, DAC 220 would need to have a sample rate (at least) four times that of a comparable DAC 120 of FIG. 1. If, however, N=2, then post-DPD processor 216 would combine the two intermediate pre-distorted signals 215(1) and 215(2) to generate the final pre-distorted digital signal $x_{pd}$[n] having a sample rate equal to twice the sample rate $F_s$ of the digital input signal x[n]. In that case, DAC 220 could have a sample rate twice that of a comparable DAC 120 of FIG. 1.

In theory, any combination of values for factors L, M, and N are possible but useful applications would generally have L>1, M≦L, and N≧1.

Higher-Speed DPD Module

Figure 3:
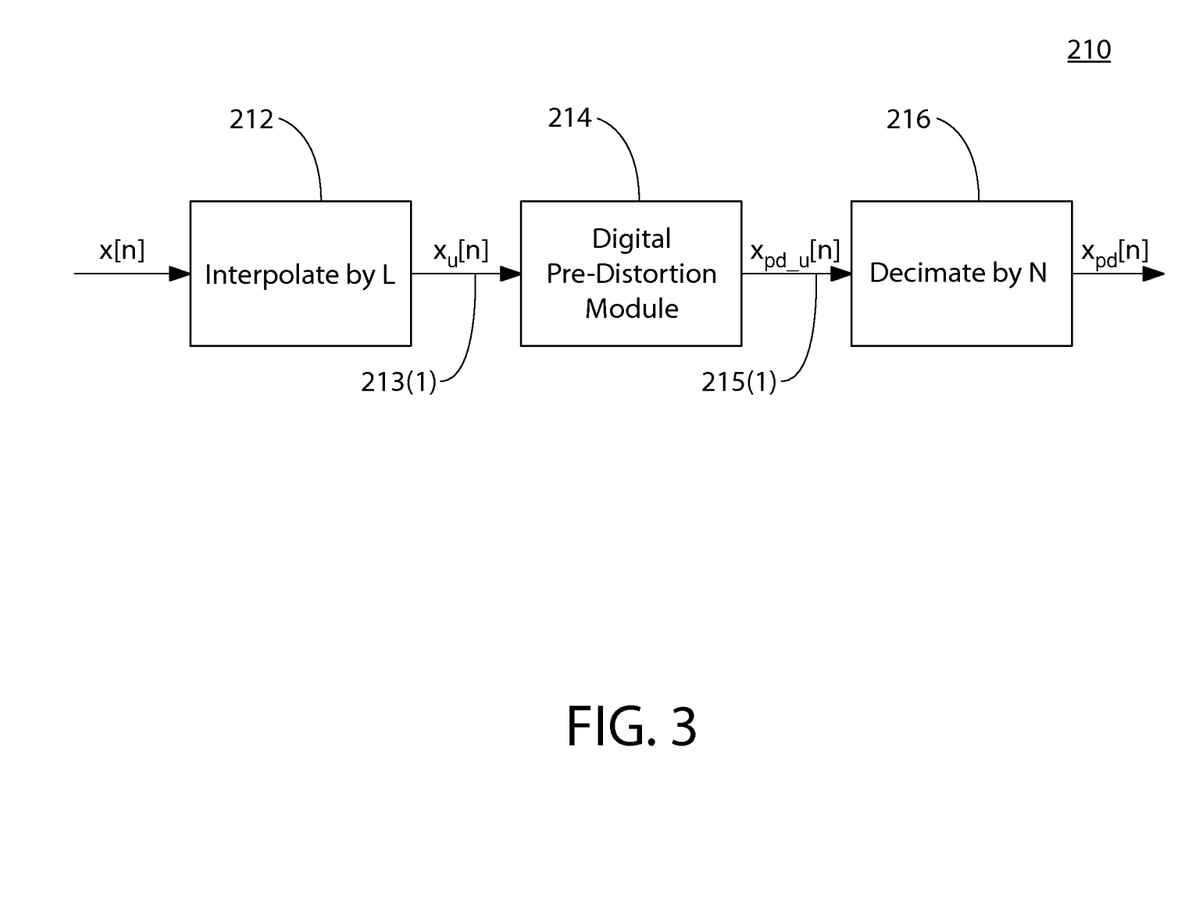
FIG. 3 shows a schematic block diagram of the digital pre-distortion (DPD) sub-system of FIG. 2, according to one embodiment involving relatively high-speed DPD processing.

FIG. 3 shows a schematic block diagram of DPD sub-system 210 of FIG. 2 according to one embodiment in which there is only a single DPD module in digital pre-distorter 214. In this case, pre-DPD processor 212 is an interpolator that interpolates the digital input signal x[n] by the interpolation factor L to generate a single higher-sample-rate version 213(1) of the digital input signal having a sample rate that is L times the sample rate $F_s$ of the digital input signal. In addition, the single DPD module 214 operates at L times the processing speed of a comparable DPD module 114 of FIG. 1 to generate a single higher-sample-rate intermediate pre-distorted signal 215(1) having a sample rate that is also L times the sample rate $F_s$ of the digital input signal x[n]. Post-DPD processor 216 is a decimator that decimates the intermediate pre-distorted signal 215(1) by the decimation factor N to generate the final pre-distorted digital signal $x_{pd}$[n].

Figure 4:
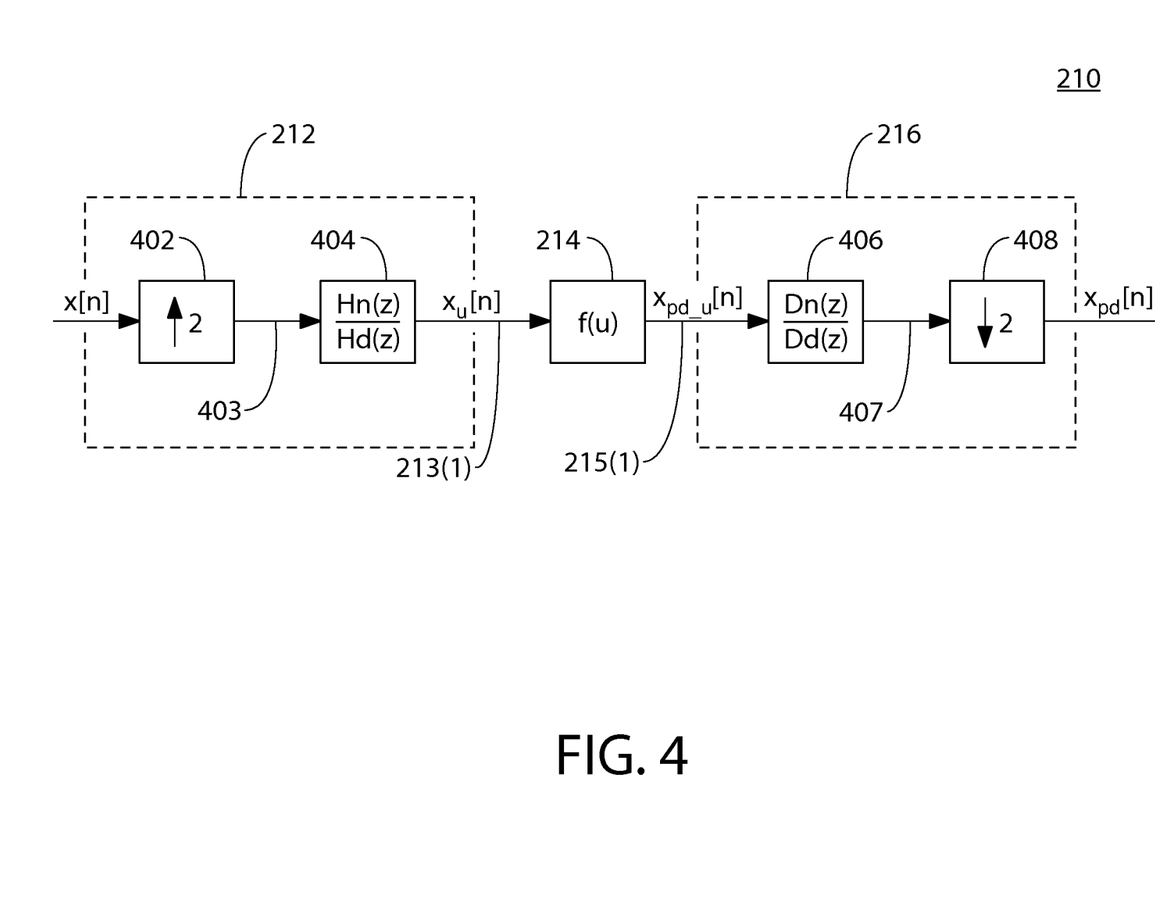
FIG. 4 shows a schematic block diagram for the DPD sub-system of FIG. 3 for interpolation and decimation factors both equal to two.

FIG. 4 shows a schematic block diagram of DPD sub-system 210 of FIG. 3, where the interpolation factor and the decimation factor are both two. As shown in FIG. 4, pre-DPD processor 212 comprises a double-rate (2×) upsampling module 402 followed by a 2× interpolation filter 404. In one possible implementation, 2× upsampling module 402 performs zero-stuffing, in which a data sample having a value of 0 is inserted between every two consecutive samples in the digital input signal x[n], resulting in a zero-stuffed digital signal 403 having twice the sample rate $F_s$ of the digital input signal. Interpolation filter 404 may be implemented as a digital finite impulse response (FIR) filter having an odd number of coefficients. Interpolation filter 404 filters zero-stuffed version 403 to generate higher-sample-rate version 213(1) of the digital input signal having twice the sample rate $F_s$ of the digital input signal.

In this embodiment, DPD module 214 operates at twice the processing speed of a comparable DPD module 114 of FIG. 1 to generate a single higher-sample-rate intermediate pre-distorted signal 215(1) also having twice the sample rate $F_s$ of the digital input signal. As shown in FIG. 4, post-DPD processor 216 comprises a 2× anti-aliasing decimation low-pass filter 406 followed by a 2× decimating module 408. Decimation filter 406 may be implemented as a digital FIR filter having an odd number of coefficients, where decimation filter 406 filters the higher-sample-rate intermediate pre-distorted signal 215(1) to generate a higher-sample-rate filtered signal 407, having twice the sample rate $F_s$ of the digital input signal x[n]. 2× downsampling module 408 downsamples the filtered signal 407 (e.g., by dropping every other sample) to generate the final pre-distorted digital signal $x_{pd}$[n] having the same sample rate $F_s$ as the digital input signal.

Polyphase Implementation

Figure 5:
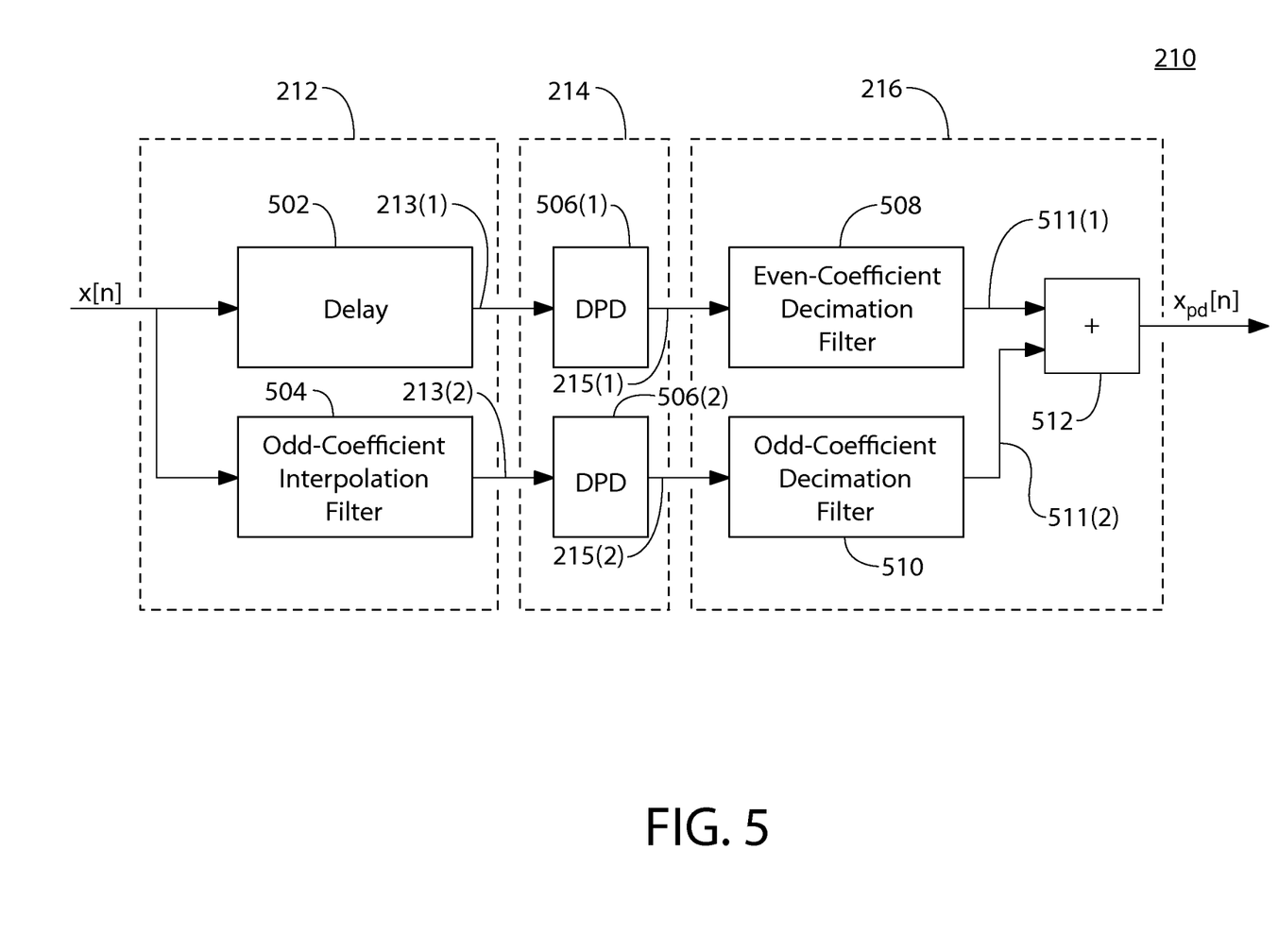
FIG. 5 shows a schematic block diagram of one possible polyphase implementation of the DPD sub-system of FIG. 2, according to one embodiment in which interpolation and decimation factors are both equal to two.

FIG. 5 shows a schematic block diagram of one possible polyphase implementation of DPD sub-system 210 of FIG. 2, according to one embodiment in which all three factors L, M, and N are equal to two. As shown in FIG. 5, in this polyphase implementation, pre-DPD processor 212 comprises a delay module 502 operating in parallel with an interpolation filter 504 whose coefficients are the odd-numbered coefficients of an ordinary 2× interpolating filter, digital pre-distorter 214 comprises two DPD modules 506(1) and 506(2) operating in parallel, and post-DPD processor 216 comprises two low-pass filters operating in parallel, with the coefficients of one filter 508 being the even-numbered coefficients of a normal low-pass filter, and the coefficients of the other filter 510 being the odd-numbered coefficients of that same normal low-pass filter. The outputs of the two filters are added together by summation node 512.

In operation, delay module 502 delays a first copy of the digital input signal x[n] to generate a first version 213(1) of the digital input signal, while odd-coefficient interpolation filter 504 filters a second copy of the digital input signal x[n] to generate a second version 213(2) of the digital input signal. In one implementation, filter 504 is a digital FIR filter whose coefficients are equal to the odd-numbered coefficients of the digital FIR filter used to implement a comparable 2× interpolation filter 404 of FIG. 4. In that case, the samples of the second-version signal 213(2) in FIG. 5 are equal to the even-numbered samples of double-rate signal 213(1) of FIG. 4, while the samples of first-version signal 213(1) in FIG. 5 are equal to the odd-numbered samples of double-rate signal 213(1) of FIG. 4. Note that the delay imposed by delay module 502 is designed to compensate for the processing delay of filter 504 so that the two versions 213(1) and 213(2) are synchronized. Note further that the sample rate of each version signal 213(i) is equal to the sample rate $F_s$ of the digital input signal x[n].

In pre-distorter 214 of FIG. 5, first DPD module 506(1) performs DPD processing on first-version signal 213(1) to generate a first intermediate pre-distorted signal 215(1), while second DPD module 506(2) performs DPD processing on second-version signal 213(2) to generate a second intermediate pre-distorted signal 215(2). Note that the same DPD processing is applied by both DPD modules 506(1) and 506(2), albeit on two different signals 213(1) and 213(2). Note further that the sample rate of each intermediate pre-distorted signal 215(i) is equal to the sample rate $F_s$ of the digital input signal x[n]. Since each DPD module 506(i) operates on a version 213(i) having the same sample rate $F_s$ as the original digital input signal x[n], the same type of hardware device (e.g., FPGA, ASIC) having the same processing speed can be used to implement each DPD module as is used to implement a comparable DPD module 114 of FIG. 1.

As further shown in FIG. 5, even-coefficient decimation filter 508 filters the first intermediate pre-distorted signal DQ(1) to generate a first filtered signal 511(1), while odd-coefficient decimation filter 510 filters the second intermediate pre-distorted signal DQ(2) to generate a second filtered digital signal 511(2). In one implementation, even-coefficient decimation filter 508 is a digital FIR filter whose coefficients are equal to the even-numbered coefficients of a comparable 2× decimation filter 406 of FIG. 4, while odd-coefficient decimation filter 510 is a digital FIR filter whose coefficients are equal to the odd-numbered coefficients of that same comparable 2× decimation filter 406. Summation node 512 combines the first and second filtered signals 511(1) and 511(2), sample by sample, to generate the final pre-distorted digital signal $x_{pd}$[n]. Note further that the sample rate of each filtered signals 511(i) and of the final pre-distorted digital signal $x_{pd}$[n] is equal to the sample rate $F_s$ of the digital input signal x[n].

As individually explained above for the specific different signals, the sample rate of every digital signal within DPD sub-system 210 as well as the sample rate of the resulting final pre-distorted digital signal $x_{pd}$[n] is the same as the sample rate $F_s$ of the original digital input signal x[n]. In this way, DPD modules 506(1) and 506(2) of the polyphase linearization scheme of FIG. 5 can be implemented using one or more hardware devices having the same processing speed as the hardware device used to implement a comparable DPD module 114 of FIG. 1. In addition, the sample rate of DAC 220 of FIG. 2 can be the same as the sample rate of a comparable DAC 120 of FIG. 1. Thus, the polyphase linearization scheme prevents aliasing of the pre-distortion signal without increasing the DAC sample rate by the same proportion and without increasing the processing speed of any DPD module. As such, better linearization can be achieved without incurring the costs associated with higher sampling rates.

Although the polyphase linearization scheme has been described in the context of FIG. 5, where the interpolation and decimation factors are both equal to two, polyphase embodiments can be implemented for any L-fold interpolation and N-fold decimation DPD scheme, where L and N are positive integers greater than one.

Moreover, the present invention can also be implemented in the context of a DPD scheme where L is a positive integer greater than N. Such an implementation can be used to generate a final pre-distorted signal $x_{pd}$[n] having a higher sample rate than the sample rate $F_s$ of the original digital input signal x[n]. As such, the sample rate of the DAC would be correspondingly higher that the sample rate of a comparable DAC 120 of FIG. 1. In particular, the sample rate of the DAC would be at least $$\frac{L}{N} \cdot F_s.$$

The optimal choices of L and N may be determined by separate requirements. The choice of L may be determined by the bandwidth expansion from the pre-distortion signal, and the choice of N may be determined by L and the maximum sample rate of the DAC. In particular, 1) The choice of L depends on the bandwidth expansion resulting from the pre-distortion function. Specifically, to avoid aliasing, the optimal L is the smallest (e.g., integer) value that satisfies:

$$BW_{x_{pd}} = L \cdot F_s.$$

Alternatively, we can say that, for a given L, the maximum un-aliased pre-distortion bandwidth that is supported is $L \cdot F_s$.

2) The optimal choice of N depends on the maximum sample rate that is supported by the DAC. The requirement is that:

$$F_{s\text{-}DAC} > L \cdot F_s / N,$$

where $F_{s\text{-}DAC}$ is the sample rate of the DAC. That is, the optimal N is the smallest (e.g., integer) value that satisfies the equation above.

Since the parameters for the optimal L and N are different, it is conceivable that the optimal choices for L and N are different. For example, if $$BW_{x_{pd}} = \frac{3}{2} \cdot F_s$$

and max($F_{s\text{-}DAC}$)=2·$F_s$, then optimal L=2 and optimal N=1.

Although the present invention has been described in the context of linearizing an analog sub-system having a non-linear amplifier, the invention can also be implemented in other contexts. For example, the invention can be implemented to linearize an analog sub-system having one or more of the following elements: baseband amplification, IF (intermediate frequency) amplification, RF amplification, frequency upconversion, frequency downconversion, vector modulation. Furthermore, depending on the frequency requirements of the particular application and the frequency capabilities of the physical components used to implement the various elements, upconverter 232 and/or downconverter 250 of FIG. 2 may be omitted. Note that, in certain implementations, upconversion and/or downconversion may be partially or even completely implemented in the digital domain. In addition, pre-distorter 214 might not be adaptive, in which case the entire feedback path of tap 240, downconverter 250, and ADC 260 may be omitted.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, general-purpose computer, or other processor.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A signal-processing system that generates an analog output signal from a digital input signal, each digital signal in the system having a corresponding sample rate, the system comprising:

a digital pre-distortion (DPD) sub-system configured to perform DPD processing to generate a final pre-distorted digital signal from the digital input signal, wherein the DPD sub-system interpolates the digital input signal based on an interpolation factor greater than one prior to performing the DPD processing;

a digital-to-analog converter (DAC) configured to convert the final pre-distorted digital signal into an analog pre-distorted signal; and an analog sub-system configured to generate the analog output signal from the analog pre-distorted signal, wherein the DPD sub-system comprises:

a pre-DPD processor configured to generate one or more versions of the digital input signal, wherein the pre-DPD processor is configured to apply at least one interpolation filter based on the interpolation factor to the digital input signal to generate at least one version of the digital input signal;

a digital pre-distorter configured to pre-distort the one or more versions of the digital input signal to generate one or more intermediate pre-distorted digital signals; and a post-DPD processor configured to generate the final pre-distorted digital signal from the one or more intermediate pre-distorted digital signals.

2. The invention of claim 1, wherein the analog sub-system comprises a non-linear amplifier configured to generate the analog output signal.

3. The invention of claim 2, wherein the analog sub-system further comprises an upconverter configured to upconvert the analog pre-distorted signal prior to amplification by the non-linear amplifier.

4. The invention of claim 1, wherein the pre-DPD processor comprises an interpolator configured to generate a single interpolated version of the digital input signal by interpolating the digital input signal based on the interpolation factor, wherein the sample rate of the single interpolated version of the digital input signal is equal to a product of (i) the interpolation factor and (ii) the sample rate of the digital input signal.

5. The invention of claim 4, wherein the digital pre-distorter comprises a single DPD module that performs the DPD processing on the single interpolated version of the digital input signal to generate a single intermediate pre-distorted digital signal having its sample rate equal to the sample rate of the single interpolated version of the digital input signal.

6. The invention of claim 5, wherein the post-DPD processor comprises a decimator configured to generate the final pre-distorted digital signal by decimating the intermediate pre-distorted digital signal based on a decimation factor.

7. The invention of claim 6, wherein the decimation factor is equal to the interpolation factor such that the sample rate of the final pre-distorted digital signal is equal to the sample rate of the digital input signal.

8. The invention of claim 6, wherein:
the interpolator comprises an upsampling module followed by an interpolation filter; and
the decimator comprises a decimation filter followed by a downsampling module.

9. The invention of claim 1, wherein:
the pre-DPD processor is configured to generate a plurality of versions of the digital input signal based on the interpolation factor;
the digital pre-distorter comprises a plurality of DPD modules configured to generate a plurality (of intermediate pre-distorted digital signals from the plurality of versions of the digital input signal, each DPD module configured to perform DPD processing on a different version of the digital input signal to generate a corresponding intermediate pre-distorted digital signal; and
the post-DPD processor is configured to generate the final pre-distorted digital signal from the plurality of intermediate pre-distorted digital signals.

10. The invention of claim 9, wherein:
the sample rate of each version of the digital input signal is equal to the sample rate of the digital input signal; and
the sample rate of each intermediate pre-distorted digital signal is equal to the sample rate of the digital input signal.

11. The invention of claim 10, wherein the sample rate of the final pre-distorted digital signal is equal to the sample rate of the digital input signal.

12. The invention of claim 9, wherein:
the interpolation factor is two;
the pre-DPD processor is configured to generate two versions of the digital input signal based on the interpolation factor;
the digital pre-distorter comprises two DPD modules configured to generate two intermediate pre-distorted digital signals from two versions of the digital input signal; and
the post-DPD processor is configured to generate the final pre-distorted digital signal from the two intermediate pre-distorted digital signals.

13. The invention of claim 12, wherein:
the pre-DPD processor comprises:
a delay module configured to delay a first copy of the digital input signal to generate a first version of the digital input signal; and
a pre-DPD filter configured to filter a second copy of the digital input signal to generate a second version of the digital input signal, wherein:
the second version of the digital input signal comprises only interpolated values of an interpolated digital signal that would be generated by applying a 2× interpolation filter to a zero-stuffed version of the digital input signal; and
the pre-DPD filter comprises only the odd-numbered coefficients of the 2× interpolation filter;
the two DPD modules of the digital pre-distorter perform the same DPD processing on the first and second versions of the digital input signal to generate first and second intermediate pre-distorted digital signals; and
the post-DPD processor comprises:
a first post-DPD filter configured to filter the first intermediate pre-distorted digital signal to generate a first filtered digital signal, wherein the coefficients of the first post-DPD filter correspond to the even-numbered coefficients of a 2× decimation filter;
a second post-DPD filter configured to filter the second intermediate pre-distorted digital signal to generate a second filtered digital signal, wherein the coefficients of the second post-DPD filter correspond to the odd-numbered coefficients of the 2× decimation filter; and
a summation node configured to combine the first and second filtered digital signals to generate the final pre-distorted digital signal.

14. The invention of claim 13, wherein the sample rate of each of the first and second versions of the digital input signal, first and second intermediate pre-distorted digital signals, the first and second filtered pre-distorted digital signals, and the final pre-distorted digital signal is equal to the sample rate of the digital input signal.

15. The invention of claim 1, wherein the interpolation performed by the DPD sub-system is implemented in a polyphase manner.

16. The invention of claim 6, wherein:
the interpolation performed by the DPD sub-system is implemented in a polyphase manner; and
the decimation performed by the decimator is implemented in a polyphase manner.

* * * * *